(12) United States Patent
Diem et al.

(10) Patent No.: US 7,700,457 B2
(45) Date of Patent: Apr. 20, 2010

(54) METHOD AND ZONE FOR SEALING BETWEEN TWO MICROSTRUCTURE SUBSTRATES

(75) Inventors: Bernard Diem, Echirolles (FR); Stephane Caplet, Sassenage (FR); Marie-Thérèse Delaye, Fontaine (FR)

(73) Assignee: Commissariat a L'Energie Atomique, Paris (FR)

( * ) Notice: Subject to any disclaimer, the term of this patent is extended or adjusted under 35 U.S.C. 154(b) by 1027 days.

(21) Appl. No.: 10/500,196

(22) PCT Filed: Dec. 17, 2002

(86) PCT No.: PCT/FR02/04383

§ 371 (c)(1), (2), (4) Date: Oct. 10, 2006

(87) PCT Pub. No.: WO03/059806

PCT Pub. Date: Jul. 24, 2003

(65) Prior Publication Data

US 2007/0122929 A1    May 31, 2007

(30) Foreign Application Priority Data

Dec. 28, 2001    (FR) ................................. 01 17015

(51) Int. Cl.
  *H01L 21/30*    (2006.01)
(52) U.S. Cl. ............... 438/456; 438/118; 257/E21.122; 257/E21.499
(58) Field of Classification Search .......... 438/51, 438/55, 118–119, 456; 257/E21.499, E21.122
See application file for complete search history.

(56) References Cited

U.S. PATENT DOCUMENTS

| 5,668,033 | A | 9/1997 | Ohara et al. |
| 6,294,402 | B1 | 9/2001 | Lau et al. |

(Continued)

FOREIGN PATENT DOCUMENTS

EP    0552 466 A2    7/1993

(Continued)

OTHER PUBLICATIONS

English Translation of Japanese Office Action from corresponding Japanese Patent Application No. 2003-559921 (2 gs).

(Continued)

*Primary Examiner*—Thanhha Pham
(74) *Attorney, Agent, or Firm*—Brinks Hofer Gilson & Lione (57) ABSTRACT

The invention concerns a sealing zone between two microstructure substrates. Said sealing zone comprises at least the following parts: on a first wafer level (20), a lower edging (22A) made of an adhesive material capable of causing the first substrate (20) to adhere to a sealing material, said sealing material being adapted to spontaneously diffuse jointly with the material of the second wafer level (30); on said lower edging (22A), a layer of said sealing material; and on said layer of sealing material, a protuberance (36) formed on said second wafer level (30) containing a certain amount of sealing material. The invention is applicable to microstructures comprising vacuum-operated components.

10 Claims, 5 Drawing Sheets

U.S. PATENT DOCUMENTS

| | | | |
|---|---|---|---|
| 6,555,901 B1 | 4/2003 | Yoshihara et al. | ........... 257/684 |
| 2001/0021570 A1 | 9/2001 | Lin et al. | |

FOREIGN PATENT DOCUMENTS

| | | | |
|---|---|---|---|
| EP | 0 982 773 A2 | | 3/2000 |
| FR | 2 558 263 | | 1/1984 |
| FR | 97-13441 | | 10/1997 |
| JP | 0520539 | * | 8/1993 |
| JP | 10-112548 | | 4/1998 |
| JP | 2001-150398 A | | 6/2001 |

OTHER PUBLICATIONS

Wolffenbuttel and Wise, "Low-temperature silicon wafer-to-wafer bonding using gold at eutectic temperature", 8253a Sensors and Actuators—A Physical, A43 (1994) May, Nos. 1/3, Lausanne, CH.

Wolffenbuttel, R.F., "Low-Temperature Silicon Wafer-To-Wafer Bonding Using Metal Intermediate Layers," Eurosensors X, Leuven, Belguim, Sep. 8-11, 1996, pp. 275-278.

* cited by examiner

METHOD AND ZONE FOR SEALING BETWEEN TWO MICROSTRUCTURE SUBSTRATES

PRIORITY APPLICATION

This application claims priority to French Patent Application No. 0117015 filed Dec. 28, 2001.

TECHNICAL FIELD

The general field of the invention is that of the collective fabrication of microstructures, usually incorporating attached components, starting from substrates (i.e. at "wafer level"), and using microelectronics techniques (deposition and etching of layers, photolithography, and the like).

BACKGROUND

The accelerometer disclosed in French patent No. FR 2 558 263 may be cited as one example of this kind of microstructure. The accelerometer comprises, within a thin layer, a first portion cut out from said thin layer and a second portion consisting of the remainder of the thin layer, the first portion being connected to the second by means of flexible beams allowing this first portion, called the "sensitive" portion, to move with a certain amplitude in the plane of the thin layer. This device is used to measure the accelerations of any system to which it is attached, by means of an electrical capacitance variation caused by said movement.

To minimize the cost of microtechnology fabrication of this kind of accelerometer, it is necessary for the basic die to have as small a surface area as possible. This implies that said sensitive portion, which serves as a seismic mass, is very small (its mass is conventionally of the order of 1 mg). Moreover, the space around it is evacuated to eliminate collisions with air molecules, which would cause unwanted accelerations of the seismic mass that would become more and more of a problem as the seismic mass became smaller and smaller.

In the case of this kind of microcomponent, and many others, it is therefore necessary to be able to maintain a vacuum in an enclosure formed within the microstructure and within which the microcomponent is placed. In the context of the invention, it will be assumed that at least two "substrates" each containing a wall portion of said enclosure are assembled together to form the microstructure or a portion of the microstructure.

BRIEF SUMMARY

The invention relates to providing a hermetic seal between two portions of a microstructure, for example an electromechanical or electro-optical device, to create within the microstructure an enclosure isolated from the exterior. The invention also relates to the collective fabrication of such microstructures.

The object of the invention is therefore to provide hermetic sealing of this kind of assembly.

The means used for this purpose must obviously be such that it does not in any way impede the operation of the microcomponent, for example by emitting a gas. Moreover, the sealing means must be mechanically robust, regardless of the temperature to which the microstructure might be exposed during subsequent fabrication steps. Finally, the sealing means must be simple to produce at low cost in the context of collective fabrication utilizing conventional microelectronics techniques.

With this in view, one prior art method of assembling dies by the "eutectic gold welding" process exploits the existence of a minimum on the liquidus line of the gold-silicon phase diagram, situated at 363° C. and with an atomic proportion of silicon equal to 31%. According to the paper by R. F. Wolffenbuttel entitled "Low-Temperature Silicon Wafer-to-Wafer Bonding using Metal Intermediate Layers", Eurosensors X, Leuven, Belgium, 8-11 Sep. 1996, there are two standard embodiments of this method.

In the first embodiment, a layer of gold is deposited, for example by evaporation, on the surface of the substrates to be welded before assembling them. However, this embodiment has the drawback that it is necessary to work in a vacuum or in a nitrogen atmosphere to prevent the formation of a silicon oxide layer on the surface of the substrates before assembly, because this $SiO_2$ layer would prevent eutectic welding.

In the second embodiment, a protection layer is deposited beforehand on the surface of each substrate. To effect the welding, a layer of gold is deposited on each substrate, and the substrates are then assembled, inserting a layer of silicon. The seal is therefore produced by this Au—Si—Au sandwich, the proportions of which are chosen to be similar to the eutectic proportions in order to obtain a seal that is robust at a relatively low temperature. To prevent the gold, on the one hand, and the silicon of the substrates, on the other hand, diffusing into each other through the protection layer, the latter is made from a material serving as a diffusion barrier, usually a metal such as titanium or chromium. Apart from the fact that this kind of method comprises numerous technology steps (in particular the deposition of a barrier layer on the surface of each substrate), the reliability of the weld produced in this way proves to be mediocre.

To avoid these problems, the invention proposes a method of sealing two substrates in a microstructure, characterized in that it comprises the following steps:

there is deposited onto the surface of a first substrate a first rim comprising an "upper" rim consisting of a layer of sealing material adapted to interdiffuse spontaneously with the material of the second substrate and a "lower" rim consisting of an adhesion material adapted to cause said first substrate to adhere to said sealing material, and there is deposited onto the surface of at least one protuberance formed on said second substrate facing the first rim a second rim consisting of a layer of said sealing material, the two portions to be assembled are brought into contact, and the sealing region is heated to obtain the interdiffusion of the sealing material and the material of the second substrate.

For example, the second substrate may be of silicon and the sealing material may be gold; this has the advantage that silicon and gold have a strong tendency to diffuse into each other, as mentioned above.

Thanks to these features, a seal is obtained having all the properties referred to above as being desirable. In particular, the protuberance formed on the second substrate firstly channels the diffusion of the sealing material to encourage depthwise diffusion and secondly increases the pressure exerted on the contact area at the time of assembly, because of the small size of the contact area.

The inventors have found that the seal obtained in this way is very reliable. This is very surprising, because it might be expected that, with the substances cited, for example, the silicon of the second substrate would diffuse through the gold of the rim deposited on a protuberance of the second substrate. This would lead to the formation of a layer of silicon oxide on the surface of the rim. As explained above, the person skilled in the art would expect that the silicon oxide layer would degrade the reliability of the bond obtained in this way when the two substrates are subsequently placed one against the other. The bond has proved to be very reliable and robust, however.

Finally, it will be noted that all these effects are obtained without it being necessary to control very precisely the quantity of sealing materials.

In some applications, it may be found that the sealing material and the first substrate chosen by the person skilled in the art have the capacity to diffuse into each other: this is the case, for example, if the sealing material is gold and the first substrate is of silicon. According to particular features of the invention, a lower rim is then preferably chosen consisting of a material adapted to provide a barrier against such diffusion. Alternatively, a diffusion barrier layer is included in said first rim, between said lower rim and said upper rim. This barrier layer could consist of tungsten, for example. This barrier layer advantageously contributes to the effect of the protuberance according to the invention, namely channeling diffusion of the sealing material inside the second substrate.

In a correlative manner, the invention relates to a sealing region between two substrates of a microstructure, said sealing region being noteworthy in that it comprises at least the following portions:

on a first substrate, a "lower" rim consisting of an adhesion material adapted to cause said first substrate to adhere to a sealing material adapted to interdiffuse spontaneously with the material of the second substrate, on said lower rim, a layer of said sealing material, and on said sealing material layer, a protuberance formed on said second substrate and containing a certain quantity of sealing material.

If said sealing material and the material of said first substrate are able to diffuse into each other, a lower rim is preferably chosen consisting of a material adapted to serve as a barrier to such diffusion. Alternatively, said sealing region will further comprise a diffusion barrier layer between said lower rim and said sealing material layer. For example, if both substrates are of silicon, then the sealing material may be gold and the barrier layer may consist of tungsten.

According to preferred features, said surface of the protuberances is not plane, but features a certain number of hollows.

Thanks to these features, when the welding method described briefly hereinabove is executed, a portion of the molten sealing material is retained in these hollows, which prevents the sealing material being discharged laterally because of the contact pressure applied during assembly, instead of diffusing into the thickness of said protuberance.

According to other preferred features, said surface of the protuberance has a meshed structure.

In the present context, the expression "meshed structure" means a set of lines providing redundancy in the seal, so that any fabrication defect in one sealing line cannot compromise the hermetic seal.

The invention is also directed to a microstructure comprising a sealing region as succinctly described hereinabove.

Other aspects and advantages of the invention will become apparent on reading the following detailed description of particular embodiments of the invention, which is given by way of non limiting example. The description refers to the appended drawings, in which:

BRIEF DESCRIPTION OF THE DRAWING

FIG. 10 is a theoretical diagram in section of a seal between one substrate and another, of which FIG. 9 is a particular application.

DETAILED DESCRIPTION

Diverse steps of the fabrication of a microstructure adapted to implement the invention are described next. The microstructure may be an accelerometer, for example, and in particular a "geophone." Geophones are highly sensitive accelerometers used to detect the reactions of the ground after shocks are applied to it, for example for the requirements of prospecting for oil.

Figure 9:
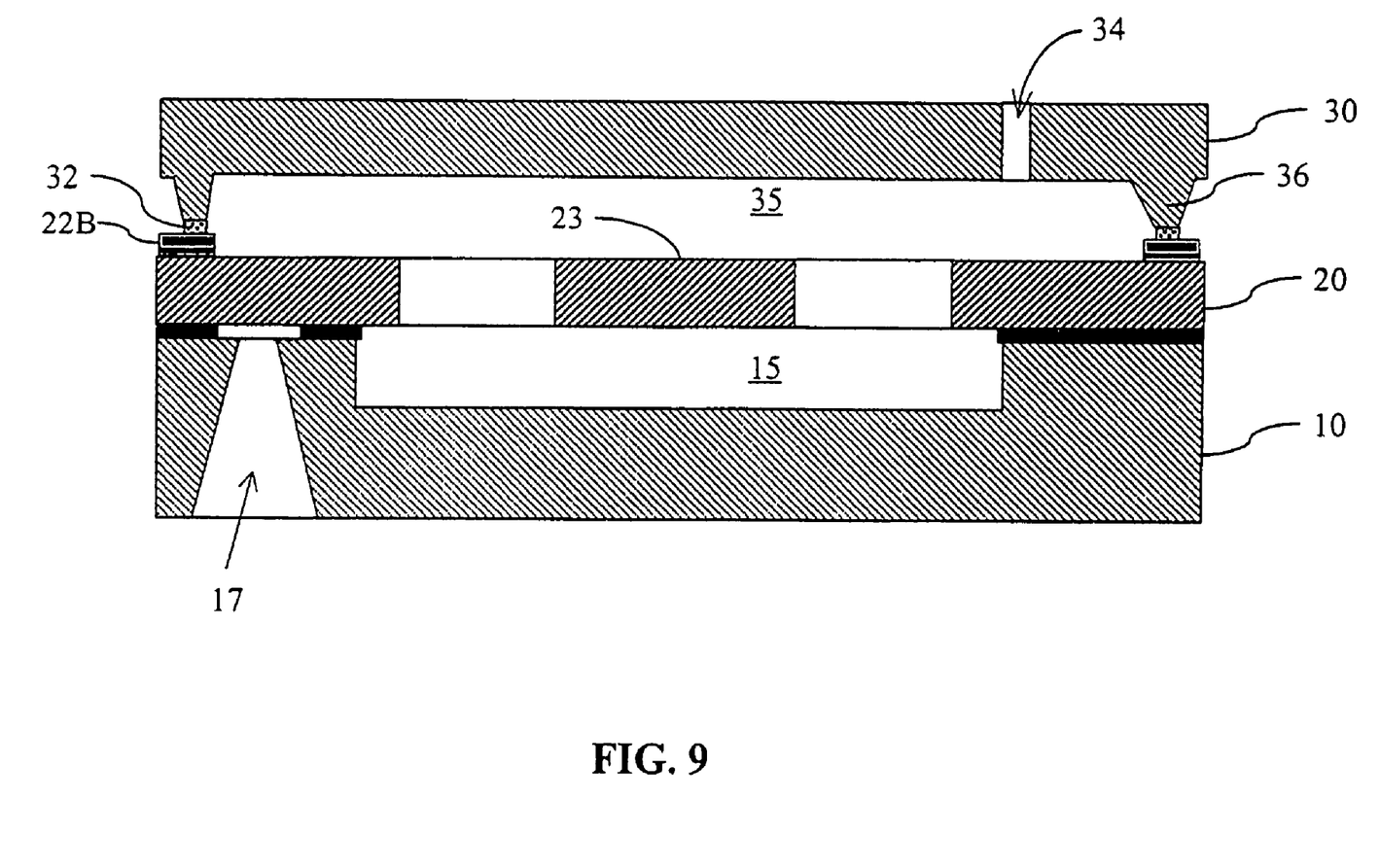
FIG. 9 is a view in section of a geophone type microstructure during finishing thereof.

FIG. 9 represents a geophone comprising at least three main portions: a central portion (comprising a sensitive region, such as a mobile mass sensitive to the accelerations to be detected by the geophone), a "lower" portion that carries the central portion, and an "upper" portion that covers the central portion and defines with the lower portion an enclosure that may be evacuated. Each of these portions is made from a respective substrate 20, 10 and 30, made of silicon in this example, using techniques described in French patent Nos. FR-2 558 263 and FR-2 770 339, for example.

FIG. 9 assembly is obtained after a series of steps, the first of which relate to the assembly and the preparation of the substrates 10 and 20. These steps are shown in FIGS. 1 to 3.

Figure 1:
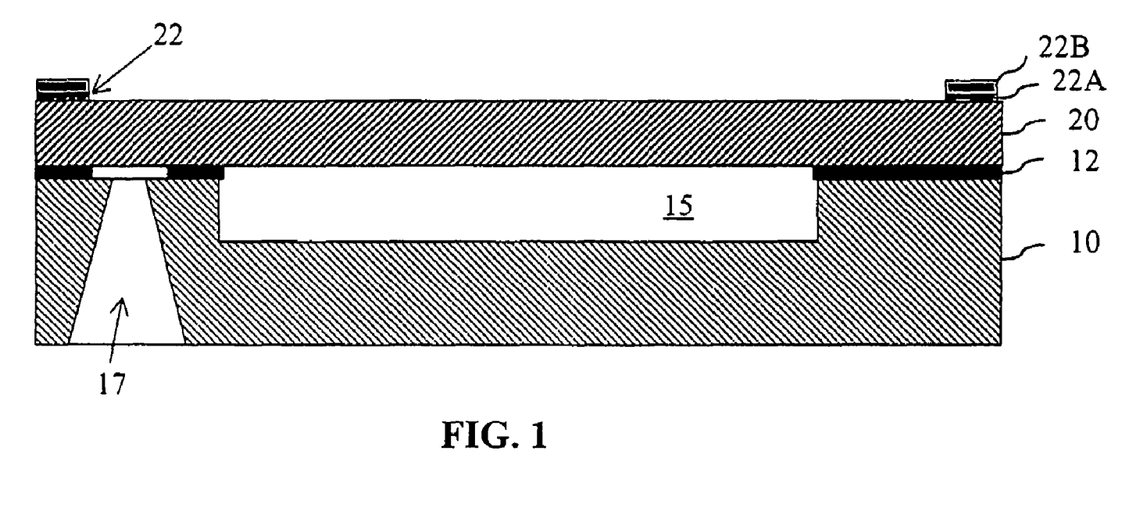
FIG. 1 is a view in section of the assembly resulting from assembling a lower substrate and a central substrate after forming a sealing rim.

As shown in FIG. 1, the substrate 20 takes the form of a thin layer that has been applied to the substrate 10, in which a cavity 15 has been formed beforehand. The thin layer is preferably applied to the substrate 10 by the Si/SiO$_2$ molecular bonding technique executed in a vacuum: the layer 12 is a layer of silicon oxide, which also serves as insulation between the thin layer 20 and the substrate 10; this bonding technique uses subsequent annealing at high temperature, for example 1100° C., to strengthen the seal.

Figure 2:
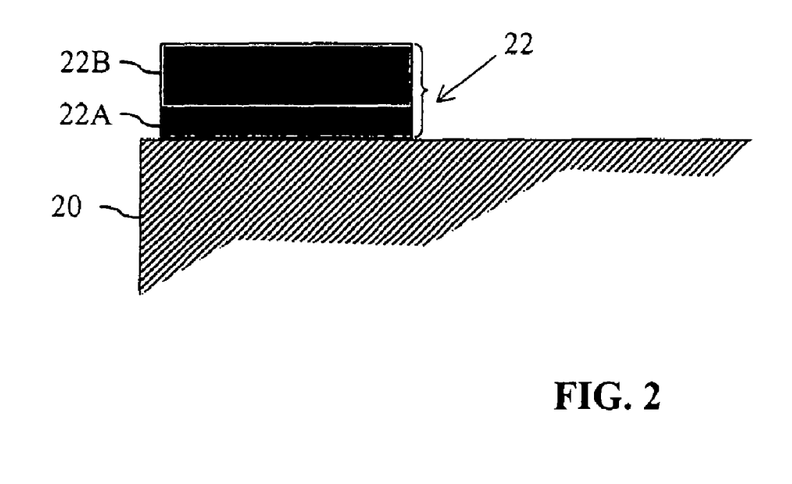
FIG. 2 is a view to a larger scale of a detail from FIG. 1.
Figure 3:
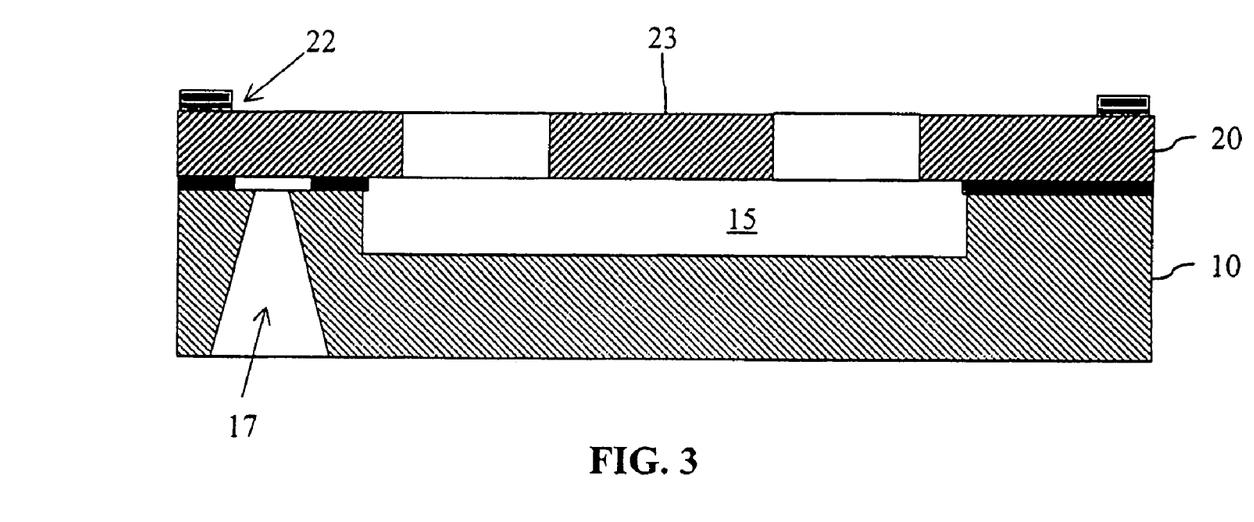
FIG. 3 is a view in section of the assembly resulting from assembling the lower substrate and the central substrate after freeing the sensitive portion.

In accordance with the present invention, a rim 22 is deposited onto the upper surface of the thin layer 20, surrounding in particular the portion of the thin layer overlying the cavity, and formed in this example by the superposition of a rim 22A and a rim 22B (as shown to a larger scale in FIG. 2). In the present example, the two rims are the same width.

The upper rim (bead) 22B is made of gold in this example and is intended to achieve sealed fixing of the upper substrate 30 to the assembly consisting of the lower substrate 10 and the central substrate 20. The choice of gold is explained by the fact that gold and silicon diffuse readily into each other and that, in this example, the upper substrate 30 is preferably of silicon. The lower rim (bead) 22A serves as an adhesion layer, and additionally as a barrier to diffusion of the material constituting the upper rim into the material constituting the thin layer 20. In this example this rim 22A is made of tungsten.

The dimensions of the two layers 22A and 22B are advantageously accurately calibrated by etching processes adapted to delimit their width and more generally their shapes.

The external face of the substrate 10 is then drilled in an area offset from the cavity 15 to form a well 17. To this end, the substrate 10 is etched throughout its thickness. The process used here is anisotropic etching using potassium hydroxide (KOH), which results in a section of the well 17 that decreases in the upward direction, i.e. toward the thin layer. This etching is continued through the oxide layer 12, in practice using a chemical etching technique, for example one employing hydrofluoric acid (HF), which undercuts the oxide layer 12 beneath the facing edges of the well 17, so that these edges overlie the thin layer 20.

The well 17 is intended for passing an electrical contact terminal through the "rear" face of the microstructure, as taught in French patent No. FR-2 770 339, which thereafter facilitates the production of a "front" hermetic seal. A single well 17 is shown in the figures, but a plurality of similar contact wells are generally provided, depending on the number of electrical connections to be made to the thin layer 20. In the example considered here, the wells are identical and have a square section.

As shown in FIG. 3, a "sensitive portion" 23 is then cut out from the thin layer 20 above the cavity 15. This cutting may be effected by dry etching, for example, so as to trim this sensitive portion mechanically and electrically. In the microstructure considered here, this sensitive portion is intended, in service, to oscillate with respect to the remainder of the thin layer 20.

Figure 4:
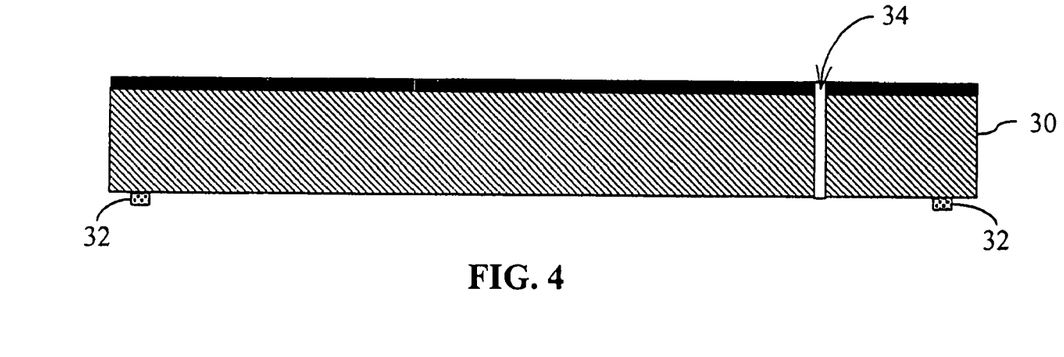
FIG. 4 is a view in section of an upper substrate.
Figure 5:
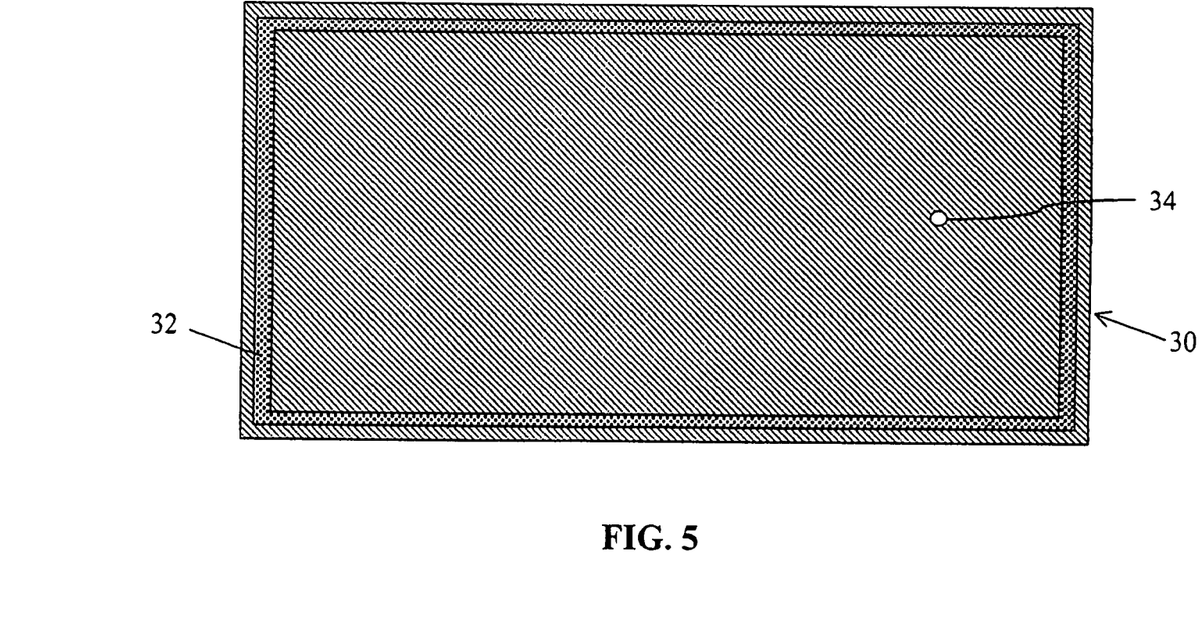
FIG. 5 is a bottom view of the upper substrate.

FIGS. 4 and 5 represent the upper substrate 30 during a first preparation step. They show, in the right-hand portion of the substrate 30, a narrow vertical channel or vent 34 passing through the complete thickness of the substrate. This is produced by ultrasonic etching or by deep reactive ion etching (DRIE).

In accordance with the present invention, a rim 32 is deposited onto one face of the substrate 30 in a pattern such that, at the time of sealing, this rim 32 is brought into contact with the rim 22 that has been deposited on the thin layer 20. Here this rim has been deposited by vapor phase deposition in a vacuum or by sputtering, for example, before being shaped by etching.

The rim 32 is made from a material that interdiffuses readily with the material of the upper substrate 30 and with the material of the upper layer 22B of the rim 22. The rims 22B and 32 are advantageously of the same material; in the example considered here, they are both made of gold.

Figure 6:
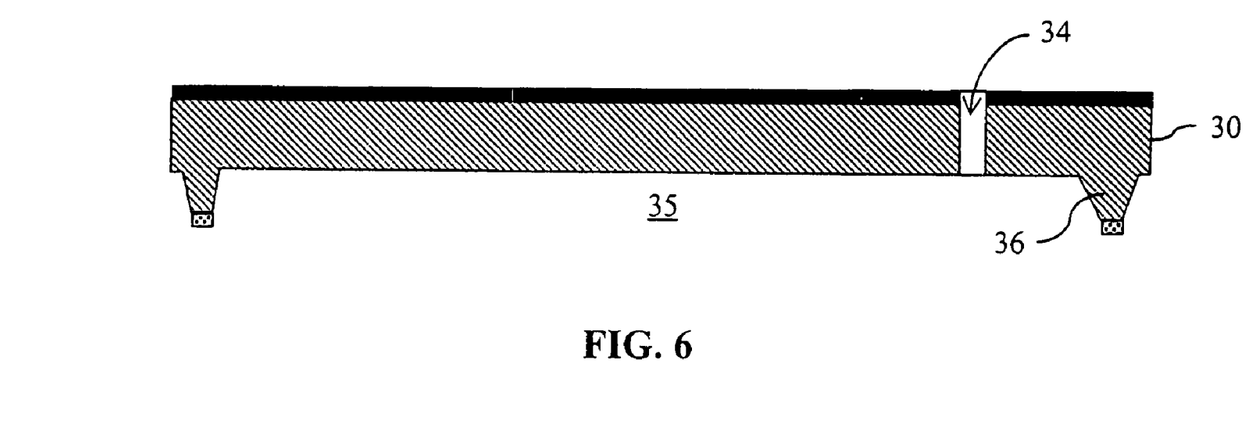
FIG. 6 is a view in section of the upper substrate after hollowing a cavity.

Following an etching step, for which the rim 32 serves as a mask, a cavity 35 is obtained in a portion of the thickness of the substrate 30 and surrounded by a continuous wall or protuberance 36 (see FIG. 6).

In this example the flanks of this projecting wall 36 are inclined; this is because the cavity 35 has been etched by a wet etching process, but other technologies may be used (in particular the DRIE technology).

Figure 7:
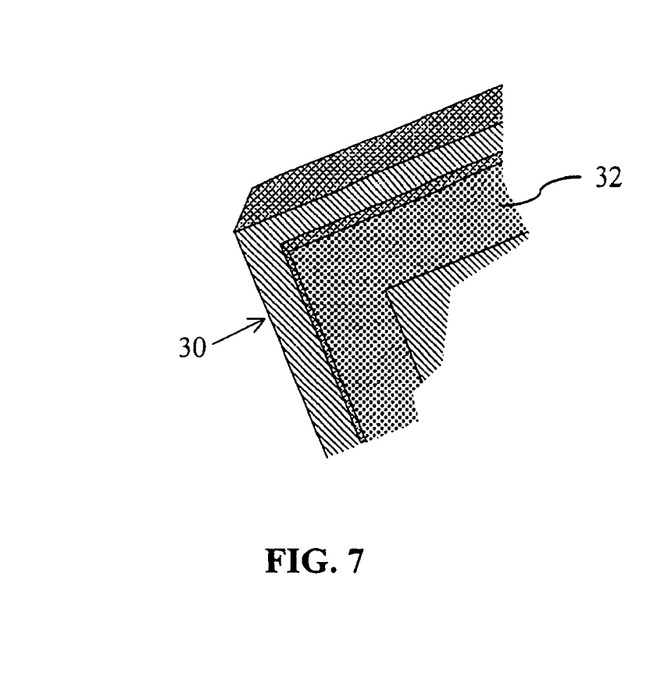
FIG. 7 is a perspective view to a larger scale of a detail from FIG. 4.

The rim 32 according to the invention may be made in various ways. Seen in perspective and to a larger scale (FIG. 7), the lower surface of the substrate 30, covered with the rim 32 from FIG. 4, is smooth. In the variant represented in FIG. 8, this surface advantageously comprises more or less complex arrays or meshes of hollows 39, in this example disposed in a row extending along the middle of the rim 32, and in practice extending through the rim 32 and into the substrate 30 itself.

Figure 8:
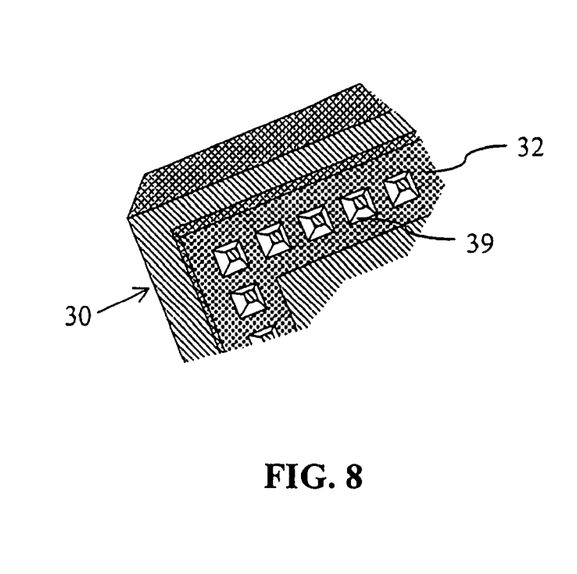
FIG. 8 is a perspective view to a larger scale of a variant of the same detail from FIG. 4.

In this example these hollows are in the shape of truncated pyramids with inclined walls, and may be produced by a wet etching process, for example one using potassium hydroxide, through a mask (not shown), which explains why the walls are inclined, here at an angle of the order of 54°. In a variant that is not shown, the hollows may have a rectangular, round or other shape, and a constant section. Furthermore, they may form an array comprising a plurality of rows, in a quincunx or other arrangement, and parallel or non-parallel to the median line of the rim. In any event, regardless of the configuration chosen, there is advantageously no passage through the wall 36, which guarantees a seal.

A certain number of preferred features of the method and the sealing region of the invention are described next.

FIG. 9 shows the upper substrate 30 from FIG. 6 in position on the assembly from FIG. 3. In the context of the application envisaged here (measuring by means of capacitance variation acceleration of the sensitive portion 23), the cavities 15 and 35 prevent the formation of stray capacitances. The vent 34 is used to evacuate the enclosure.

Here the rim 32 is narrower than the upper rim 22B formed at the periphery of the thin layer; moreover, its thickness (the vertical dimension in this figure) is preferably less than that of the upper rim 22B (for example 0.1 μm for the rim 32 and 1 μm for the rim 22B).

The assembly is sealed by heat treatment at a temperature of the order of 400° C., so as to cause the material constituting the rims 22B and 32 to diffuse in the depthwise direction into the thickness of the wall 36, which in this example corresponds to causing the gold to diffuse upwardly into the silicon wall: the rim 22B is fixed, by construction, to the thin layer; being in this example of the same kind as the material of the rim 32, this rim 22B is sealed spontaneously to the rim 32, and the interdiffusion of the gold contained in these rims with the silicon of the wall 36 seals the wall to the thin layer (the rim 32 serves as a starter and the rim 22B serves as a reserve). The effectiveness of the seal results in particular from the existence of an Au—Si eutectic, which guarantees a strong tendency of the gold to bond to the silicon atoms of the wall. Without wishing to be bound to one particular phenomenon, it would even seem that the seal obtained results from the formation of this kind of eutectic in the mass of the wall, despite the fact that the concentration of gold in the silicon probably varies as a function of the distance from the interface between the wall and the thin layer.

The dimensions of the rim 22B are sufficient to guarantee that there is sufficient gold available to diffuse into the silicon and provide a good seal. However, the quantity of gold is limited by the fact that the area of the upper substrate 30 into which the gold diffuses (the protuberance 36) is narrow. This rim 22B therefore provides a "reserve" function for the seal. Remember that the rim 22A forms a barrier preventing the gold from diffusing toward the interior of the thin layer 20, with the result that no gold may be consumed on this side.

The seal has proved to be a good seal to liquids and gases. Moreover, it has always proved to be very robust.

It will also be noted that the seal may be obtained either in a vacuum or at a controlled gas pressure.

Figure 10:
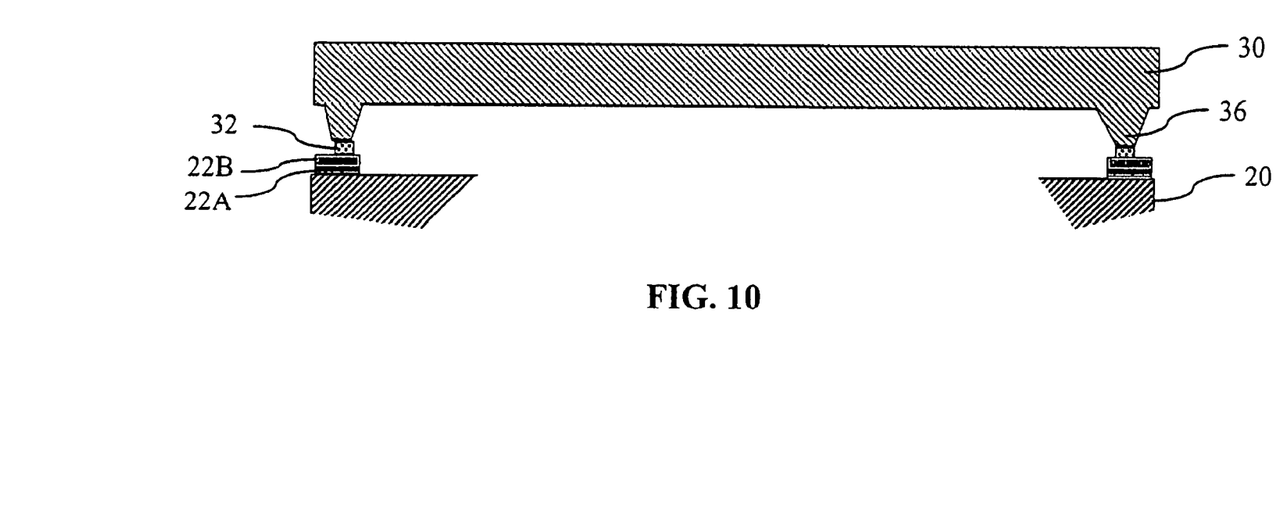

In conclusion, FIG. 10 represents the general principle of sealing by means of two chemical elements capable of forming a eutectic. The method of the invention utilizes, on a first substrate 20, a two-layer rim 22 whose shape corresponds to the contour around which a seal is required and, on a second substrate 30, a facing rim 32, disposed on the edge of a projecting contour (or protuberance) 36. The upper layer 22B of the first rim and the second rim 32 are in principle of the same material, referred to herein as the sealing material and adapted to interdiffuse easily with the material constituting the projecting contour 36, and the lower layer 22A of the first rim is of a material through which the sealing material has no tendency to diffuse. If the projecting contour is of Si, the first material is advantageously Au. Without wishing to be bound to this explanation, it is assumed that sealing at moderate temperature results from obtaining an Au—Si eutectic. The second rim serves as a starter of the phenomenon, which is maintained by consuming the upper layer of the first rim, which thus serves as a reserve. The concentration gradients imply that the eutectic composition is not obtained uniformly.

The present invention is not limited to the embodiments described hereinabove: the person skilled in the art will be able to develop diverse variants of the invention that remain within the scope of the appended claims. In particular, the device for maintaining the vacuum in accordance with the invention may be placed adequately in diverse systems intended to operate in a vacuum, other than the accelerometers described herein by way of example.

The invention claimed is:

1. A method of sealing two substrates in a microstructure comprising the following steps:

depositing a first rim onto a surface of a first substrate, said first rim comprising an upper rim comprising a layer of sealing material that interfuses spontaneously with a material of a second substrate and a lower rim comprising an adhesion material that adheres said first substrate with said sealing material;

depositing a second rim onto said second substrate facing said first rim, said second rim comprising a layer of said sealing material;

wherein said second rim overlies a surface of at least one protuberance on said second substrate, the at least one protuberance having a plurality of hollows or a meshed structure and adapted to channel the diffusion of said sealing material;

bringing said upper rim and said second rim into contact; and heating said sealing material to interfuse said sealing material and said material of said second substrate, wherein the hollows or meshed structure of the at least one protuberance channel the diffusion of said sealing material and substantially prevent the sealing material from lateral discharge.

2. The sealing method according to claim 1, wherein said sealing material and a material of said first substrate comprise materials that diffuse into each other and wherein said lower rim forms a barrier to diffusion.

3. The sealing method according to claim 2, wherein said barrier comprises tungsten.

4. The sealing method according to claim 1, wherein said sealing material and a material of said first substrate comprise materials that diffuse into each other and wherein said first rim further comprises a layer forming a barrier to diffusion between said lower rim and said upper rim.

5. The sealing method according to claim 1, wherein said first substrate comprises silicon.

6. The sealing method according to claim 1, wherein said second substrate comprises silicon.

7. The sealing method according to claim 1, wherein said sealing material comprises gold.

8. The sealing method according to claim 1 further comprising etching said second substrate using said second rim as an etch mask to form said at least one protuberance.

9. The sealing method according to claim 1, wherein said upper rim is configured to form a reservoir for said sealing material and to facilitate interdiffusing said sealing material and said material of said second substrate.

10. The sealing method according to claim 1, wherein said plurality of hollows or meshed structure is configured to retain a portion of molten sealing material.

* * * * *

UNITED STATES PATENT AND TRADEMARK OFFICE
CERTIFICATE OF CORRECTION

PATENT NO. : 7,700,457 B2  Page 1 of 1
APPLICATION NO. : 10/500196
DATED : April 20, 2010
INVENTOR(S) : Bernard Diem et al.

It is certified that error appears in the above-identified patent and that said Letters Patent is hereby corrected as shown below:

On the Title Page

Item (75), replace "Stephane Caplet" with --Stéphane Caplet--.

Signed and Sealed this

Twenty-seventh Day of July, 2010

David J. Kappos
*Director of the United States Patent and Trademark Office*